(12) United States Patent
Tsukui et al.

(10) Patent No.: US 12,351,066 B2
(45) Date of Patent: Jul. 8, 2025

(54) VEHICLE

(71) Applicant: SUBARU CORPORATION, Tokyo (JP)

(72) Inventors: Isao Tsukui, Tokyo (JP); Yusuke Okubo, Tokyo (JP); Takahiro Ueki, Tokyo (JP); Tatsuya Ishibashi, Tokyo (JP); Mami Osawa, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 712 days.

(21) Appl. No.: 17/690,362

(22) Filed: Mar. 9, 2022

(65) Prior Publication Data
US 2022/0297570 A1   Sep. 22, 2022

(30) Foreign Application Priority Data
Mar. 18, 2021   (JP) .................. 2021-045044

(51) Int. Cl.
*B60L 58/16*   (2019.01)
*B60L 58/12*   (2019.01)
*G01R 31/367*   (2019.01)
*G01R 31/392*   (2019.01)
*H01M 10/48*   (2006.01)

(52) U.S. Cl.
CPC .............. *B60L 58/16* (2019.02); *B60L 58/12* (2019.02); *G01R 31/367* (2019.01); *G01R 31/392* (2019.01); *H01M 10/48* (2013.01); *B60L 2240/549* (2013.01); *H01M 2220/20* (2013.01)

(58) Field of Classification Search
CPC .... B60L 58/16; B60L 58/12; B60L 2240/549; B60L 3/12; B60L 3/0046; B60L 2260/44; G01R 31/367; G01R 31/392; H01M 10/48; H01M 2220/20
See application file for complete search history.

(56) References Cited

U.S. PATENT DOCUMENTS

| | | | |
|---|---|---|---|
| 2005/0083017 A1* | 4/2005 | Suzuki | B60W 10/26 320/128 |
| 2014/0336965 A1* | 11/2014 | Mori | G01L 31/3648 702/63 |
| 2016/0297318 A1* | 10/2016 | Kirimoto | B60L 15/20 |

FOREIGN PATENT DOCUMENTS

JP   2009060725 A   *   3/2009

* cited by examiner

*Primary Examiner* — Catherine T. Rastovski
*Assistant Examiner* — Lal C Mang
(74) *Attorney, Agent, or Firm* — Rimon P.C.

(57) ABSTRACT

A vehicle includes at least one processor, at least one memory, and a storage. The processor functions as a current-value acquirer that acquires a current value of a battery mounted on the vehicle, a current-value frequency distribution deriver that increments an acquisition count for one of classes, to which the current value belongs, and derives a current-value frequency distribution representing acquisition counts for the respective classes, and a current-value rate distribution deriver that transforms the acquisition counts to acquisition rates each indicating a rate of the each of the acquisition counts to a total of the acquisition counts and derives a current-value rate distribution representing the acquisition rates. The processor further functions as a traveling pattern rate deriver that derives on the basis of an actual current-value rate distribution and predetermined current-value rate distributions stored in the storage, traveling pattern rates indicating rates of the respective predetermined current-value rate distributions.

9 Claims, 13 Drawing Sheets

FIG. 7
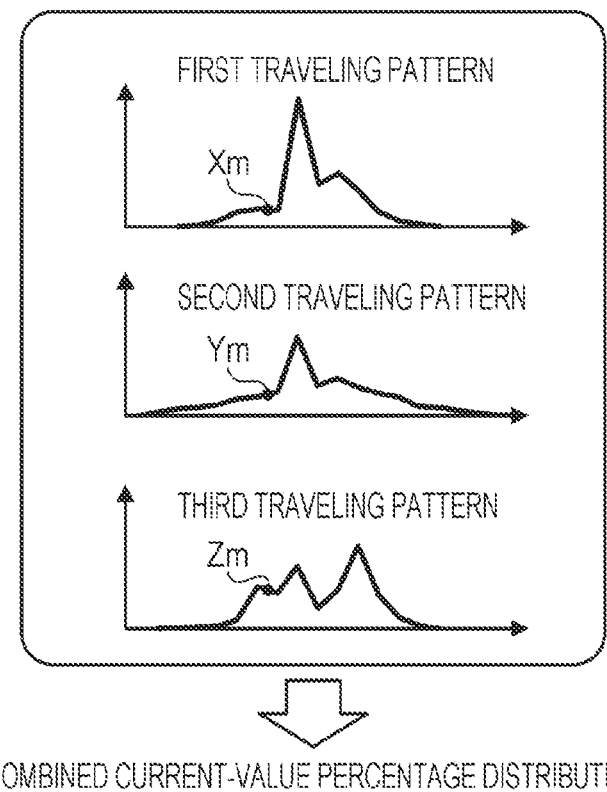
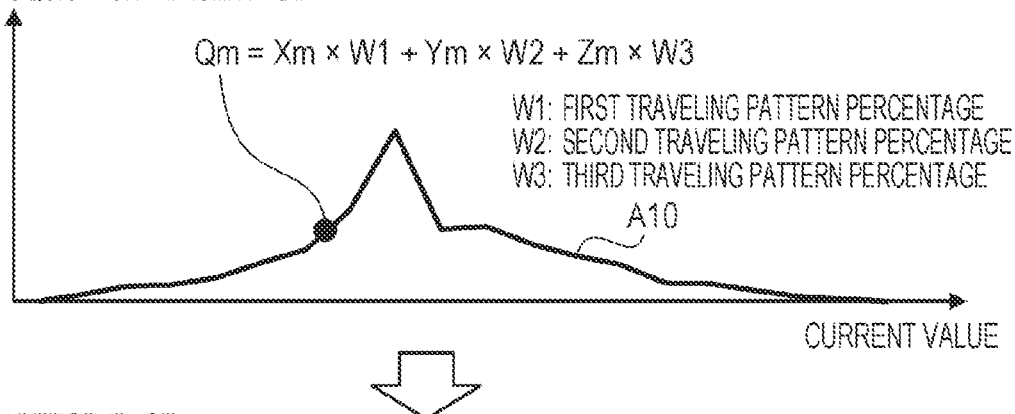
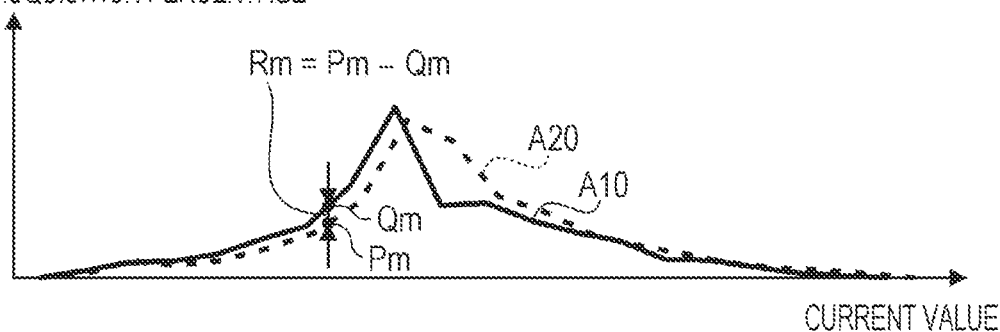

FIG. 11

|  | FIRST TRAVELING PATTERN | SECOND TRAVELING PATTERN | THIRD TRAVELING PATTERN |
|---|---|---|---|
| PREDETERMINED BATTERY DETERIORATION DEGREE (%) | 0.25 | 0.55 | 0.4 |

* DRIVING DISTANCE: 10000 km

FIG. 12

|  | FIRST TRAVELING PATTERN | SECOND TRAVELING PATTERN | THIRD TRAVELING PATTERN | TOTAL |
|---|---|---|---|---|
| TRAVELING PATTERN PERCENTAGE (%) | 30 | 60 | 10 | 100 |
| DRIVING DISTANCE (km) | 6 | 12 | 2 | 20 |
| PREDETERMINED BATTERY DETERIORATION DEGREE (%) | 0.25 | 0.55 | 0.4 | – |
| BATTERY DETERIORATION DEGREE (%) | 0.00015 | 0.00066 | 0.00008 | 0.00089 |

VEHICLE

CROSS-REFERENCE TO RELATED APPLICATIONS

The present application claims priority from Japanese Patent Application No. 2021-045044 filed on Mar. 18, 2021, the entire contents of which are hereby incorporated by reference.

BACKGROUND

The disclosure relates to a vehicle.

For example, Japanese Unexamined Patent Application Publication No. 2009-60725 discloses an example vehicle in which a history of battery charge and discharge is stored and the amount of power generated by a power generating device is determined such that the distribution of a charging current and the distribution of a discharging current are balanced.

SUMMARY

An aspect of the disclosure provides a vehicle equipped with a battery and including at least one processor, at least one memory coupled to the at least one processor, and a storage. The at least one processor is configured to cooperate with a program stored in the at least one memory to function as a current-value acquirer, a current-value frequency distribution deriver, and a current-value rate distribution deriver. The current-value acquirer is configured to acquire current values of the battery charged and discharged during traveling of the vehicle. The current-value acquirer is configured to acquire each of the current values each time a predetermined time elapses during the traveling of the vehicle. The current-value frequency distribution deriver is configured to derive a current-value frequency distribution. The current-value frequency distribution represents a frequency distribution of acquisition counts of the current values for classes. The current-value frequency distribution includes the classes into which a possible range of the current values are divided. The current-value frequency distribution deriver is configured to increment, upon acquiring of each of the current values by the current-value acquirer, a corresponding acquisition count that is one of the acquisition counts for one of the classes to which the each of the current values belongs. The current-value rate distribution deriver is configured to transform the acquisition counts in the current-value frequency distribution for a predetermined period to acquisition rates each indicating a rate of the each of the acquisition counts for the predetermined period to a total of the acquisition counts for the predetermined period, and to derive a current-value rate distribution that represents a distribution of the acquisition rates for the classes. In the storage, predetermined current-value rate distributions that respectively represent current-value rate distributions in a case of traveling in traveling patterns set in advance are stored. The at least one processor is configured to further function as a traveling pattern rate deriver. The traveling pattern rate deriver is configured to derive, on a basis of an actual current-value rate distribution that represents the current-value rate distribution based on actual driving and on the basis of the predetermined current-value rate distributions corresponding to the respective traveling patterns, traveling pattern rates that indicate rates of the respective predetermined current-value rate distributions in a case where the actual current-value rate distribution is represented by a combination of the predetermined current-value rate distributions.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

FIG. 7 is a diagram for describing deriving of traveling pattern percentages;

FIG. 11 is a diagram illustrating example predetermined battery deterioration degrees;

FIG. 12 is a diagram for describing deriving of a battery deterioration degree by a battery deterioration degree deriver;

DETAILED DESCRIPTION

Examples of parameters related to vehicles include the state of health (SOH) of a battery that supplies power to a drive motor. It may be difficult to estimate the SOH during driving in which a charging current and a discharging current frequently change. As a result, it may be difficult to grasp a battery deterioration degree that indicates the degree of deterioration of the battery. Therefore, it is anticipated that parameters, including the battery deterioration degree, that are related to vehicles and that are difficult to be derived during driving can be estimated.

Accordingly, it is desirable to provide a vehicle with which parameters related to the vehicle can be estimated.

In the following, some embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale.

Throughout the present specification and the drawings, elements having substantially the same function and configuration are denoted with the same numerals to avoid any redundant description.

First Embodiment

Figure 1:
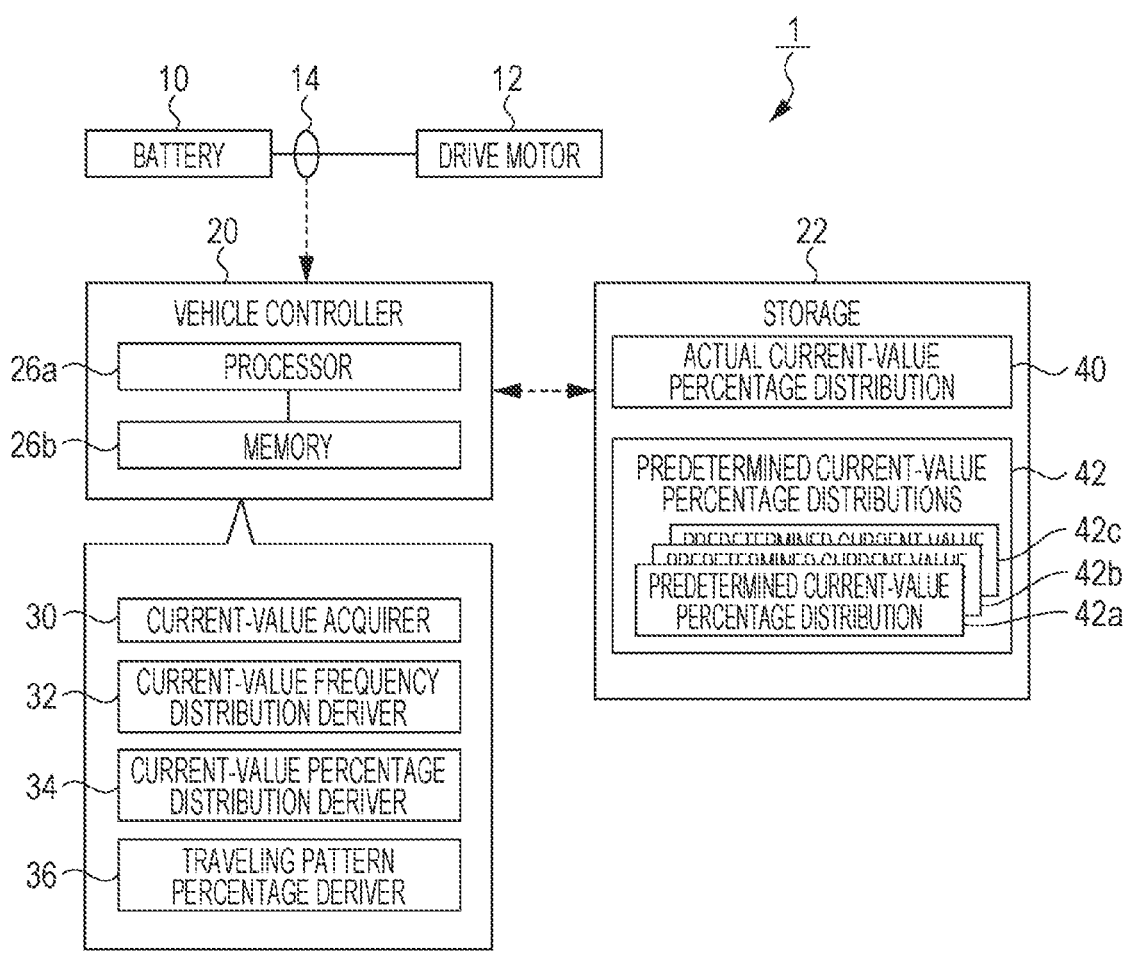
FIG. 1 is a schematic diagram illustrating a configuration of a vehicle according to an embodiment.

FIG. 1 is a schematic diagram illustrating a configuration of a vehicle 1 according to a first embodiment. The vehicle 1 is, for example, an electric vehicle or a hybrid electric vehicle. In the vehicle 1, a battery 10 is mounted. The battery 10 is a chargeable and dischargeable secondary battery, such as a lithium-ion battery. The battery 10 supplies power to a drive motor 12 that is a drive source of the vehicle 1. The drive motor 12 generates power as the wheels revolve during, for example, deceleration of the vehicle 1. The power generated by the drive motor 12 is fed back into the battery 10.

The vehicle 1 includes a current detector 14, a vehicle controller 20, and a storage 22 in addition to the battery 10 and the drive motor 12. The current detector 14 is provided at the output end of the battery 10. The current detector 14 measures the charging current and the discharging current of the battery 10.

The vehicle controller 20 includes at least one processor 20a and at least one memory 20b coupled to the processor 20a. The memory 20b includes a read-only memory (ROM) that stores a program and so on and a random access memory (RAM) that serves as a work area. The processor 20a of the vehicle controller 20 controls the vehicle 1 as a whole in cooperation with the program. The processor 20a of the vehicle controller 20 executes the program to thereby also function as a current-value acquirer 30, a current-value frequency distribution deriver 32, a current-value percentage distribution deriver 34, and a traveling pattern percentage deriver 36.

The current-value acquirer 30 acquires via the current detector 14 the current value of the battery 10 that is charged or discharged during traveling, each time a predetermined time elapses. The current-value acquirer 30 acquires the current value of a discharging current as a positive value and acquires the current value of a charging current as a negative value. The current-value acquirer 30 acquires the current value, for example, every 10 ms. Note that the time intervals at which the current value is acquired are not limited to time intervals of 10 ms and may be set as appropriate. When acquiring the current value, the current-value acquirer 30 increments the total current-value acquisition count.

The current-value frequency distribution deriver 32 derives a current-value frequency distribution described below on the basis of current values acquired by the current-value acquirer 30.

Figure 2:
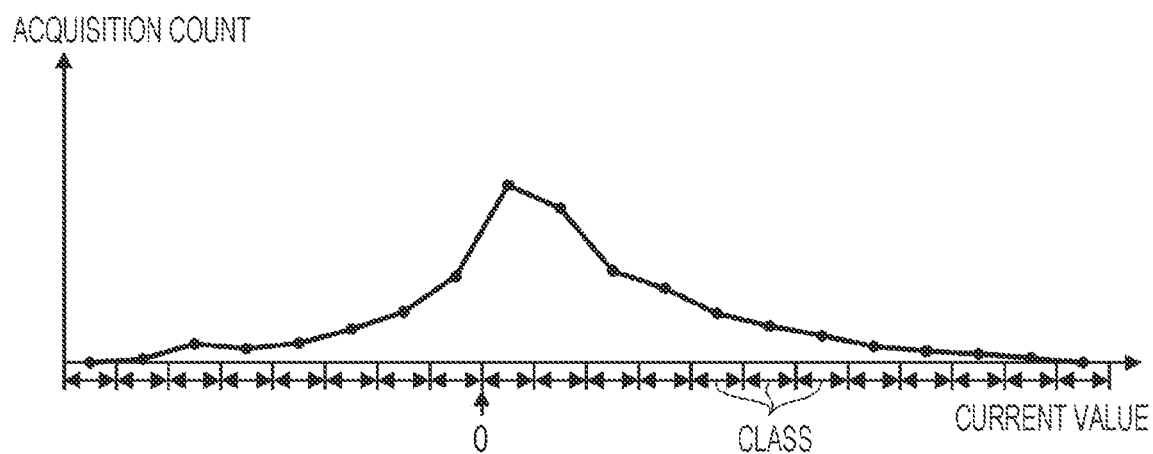
FIG. 2 is a diagram illustrating an example current-value frequency distribution.

FIG. 2 is a diagram illustrating an example current-value frequency distribution. The horizontal axis in FIG. 2 represents the current value. The current value represented by the horizontal axis and increasing from 0 indicates that the discharging current increases. The current value represented by the horizontal axis and decreasing from 0 indicates that the charging current increases.

In the current-value frequency distribution, the possible range of the acquired current value is divided into a plurality of classes. In FIG. 2, each class is indicated by a double-sided arrow. For example, the possible range of the current value is divided into classes of 20 A. In this case, the width of each class is 20 A. Note that the width of classes and the number of classes can be set to any values in accordance with, for example, the width the possible range of the current value. Hereinafter, the classes may be called a 1st class, a 2nd class, and so on in descending order of current value.

The vertical axis in FIG. 2 represents the current-value acquisition count. In other words, the current-value acquisition count for each class corresponds to the frequency of the class. That is, the current-value frequency distribution represents a frequency distribution of the current-value acquisition count for each class.

The current-value frequency distribution deriver 32 increments each time a current value is acquired, the current-value acquisition count for a class to which the acquired current value belongs to thereby derive the current-value frequency distribution. For example, it is assumed that the current-value range of a certain class is a range of 20 A or more and less than 40 A and that a current value of 30 A is acquired at a certain timing. A current value of 30 A belongs to the class of 20 A or more and less than 40 A. In this case, the current-value frequency distribution deriver 32 increments the acquisition count for the class of 20 A or more and less than 40 A by one. The current-value frequency distribution deriver 32 thus increments the acquisition count each time a current value is acquired to thereby update the current-value frequency distribution.

The current-value percentage distribution deriver 34 derives a current-value percentage distribution described below from the current-value frequency distribution derived by the current-value frequency distribution deriver 32.

Figure 3:
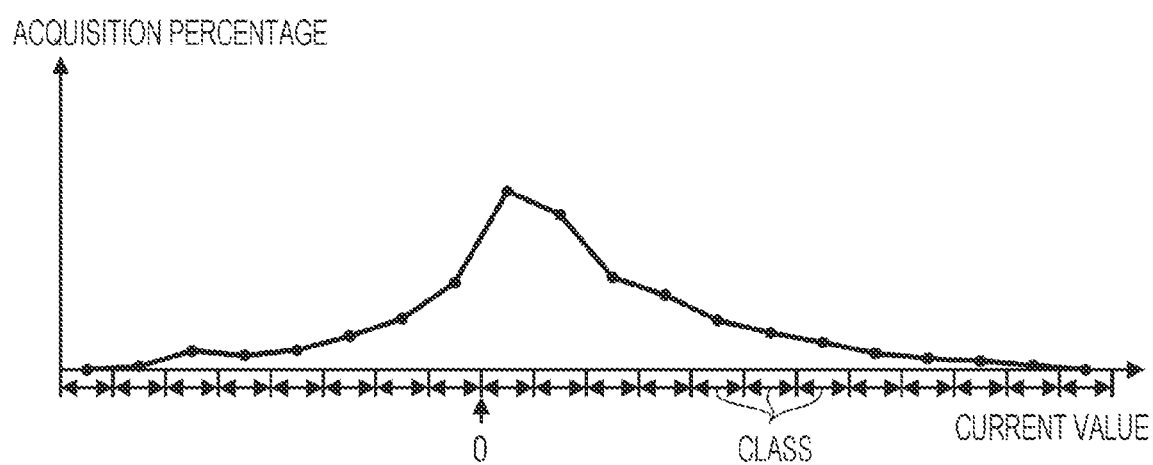
FIG. 3 is a diagram illustrating an example current-value percentage distribution.

FIG. 3 is a diagram illustrating an example current-value percentage distribution. The horizontal axis in FIG. 3 represents the current value similarly to the horizontal axis of the current-value frequency distribution illustrated in FIG. 2. In the current-value percentage distribution, the possible range of the acquired current value is divided into a plurality of classes as in the current-value frequency distribution.

The vertical axis in FIG. 3 represents the current-value acquisition rate. For example, the acquisition rate may be the current-value acquisition percentage. The acquisition rate is a rate calculated by dividing the acquisition count for each class in the current-value frequency distribution for a predetermined period by the total current-value acquisition count for the predetermined period. An example is assumed where a current value has been acquired 10000 times and a current-value frequency distribution has been derived. In this example, it is assumed that the acquisition count for the class of 20 A or more and less than 40 A is 1000. In this case, the acquisition percentage for the class of 20 A or more and less than 40 A is 10%, which is calculated by dividing 1000 times by 10000 times, which is the total acquisition count. Although, for example, the class of 20 A or more and less than 40 A has been described, for the current-value percentage distribution, the acquisition percentage is derived for every class by dividing the acquisition count for the class by the total acquisition count. Therefore, the acquisition percentage for each class is 100% or less, and the sum total of the acquisition percentages for all classes is equal to 100%.

As described above, the current-value percentage distribution represents a distribution of the current-value acquisition percentages for the classes. The current-value percentage distribution deriver 34 transforms the acquisition count for each class in the current-value frequency distribution to the acquisition percentage for the class to thereby derive the current-value percentage distribution.

Referring back to FIG. 1, the storage 22 is formed of a nonvolatile storage cell. The current-value percentage distribution deriver 34 derives the current-value percentage distribution based on current values during a driving period in which driving has been actually performed. Hereinafter, the current-value percentage distribution based on current values during a driving period in which driving has been actually performed may be called an actual current-value percentage distribution 40. As illustrated in FIG. 1, the actual current-value percentage distribution 40 that is derived is stored in the storage 22.

In the storage 22, predetermined current-value percentage distributions 42 that respectively represent current-value percentage distributions in a case of traveling in a plurality of traveling patterns set in advance are stored. For example, in the storage 22, a predetermined current-value percentage distribution 42a in a case of traveling in a first traveling pattern, a predetermined current-value percentage distribution 42b in a case of traveling in a second traveling pattern, and a predetermined current-value percentage distribution 42c in a case of traveling in a third traveling pattern are stored. The number of predetermined current-value percentage distributions 42 is to be equal to the number of traveling patterns, and two types or four or more types of predetermined current-value percentage distributions 42 may be stored instead of three types of predetermined current-value percentage distributions 42.

The traveling patterns respectively simulate various traveling environments including traveling in an urban area, traveling in a suburban area, and traveling along an expressway and represent forms of traveling in each of which predetermined acceleration and deceleration take place. For example, the first traveling pattern is a traveling pattern that simulates traveling in an urban area, the second traveling pattern is a traveling pattern that simulates traveling in a suburban area, and the third traveling pattern is a traveling pattern that simulates traveling along an expressway. Note that the number of traveling patterns is not limited to three and may be two or four or more.

Figure 4:
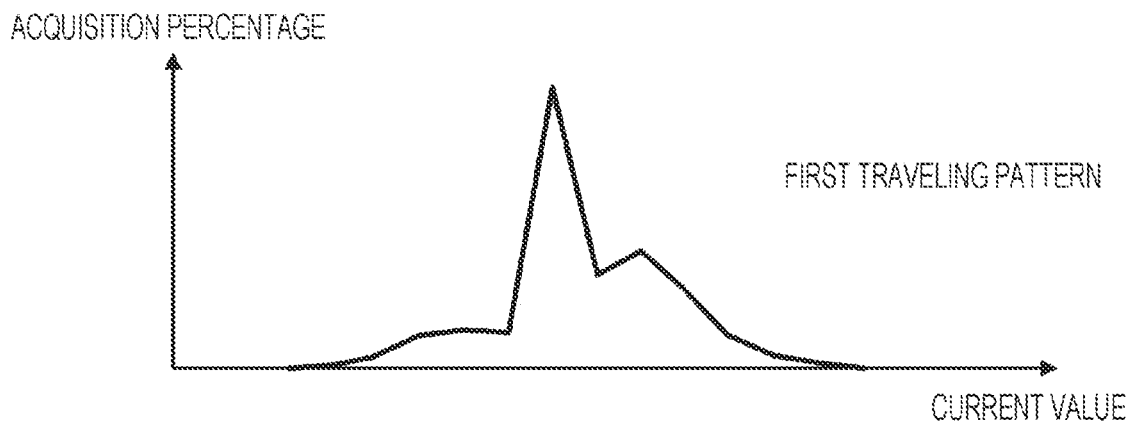
FIG. 4 is a diagram illustrating an example predetermined current-value percentage distribution in a case of traveling in a first traveling pattern.
Figure 5:
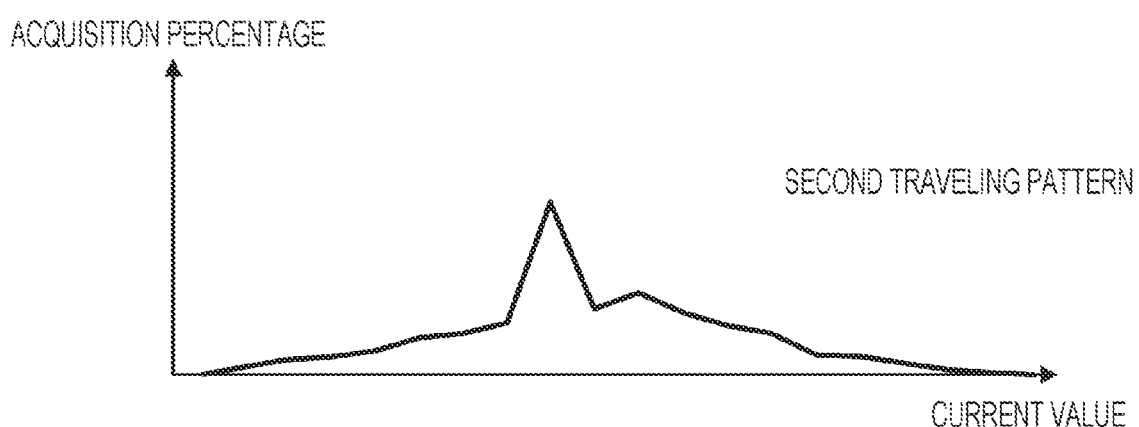
FIG. 5 is a diagram illustrating an example predetermined current-value percentage distribution in a case of traveling in a second traveling pattern.
Figure 6:
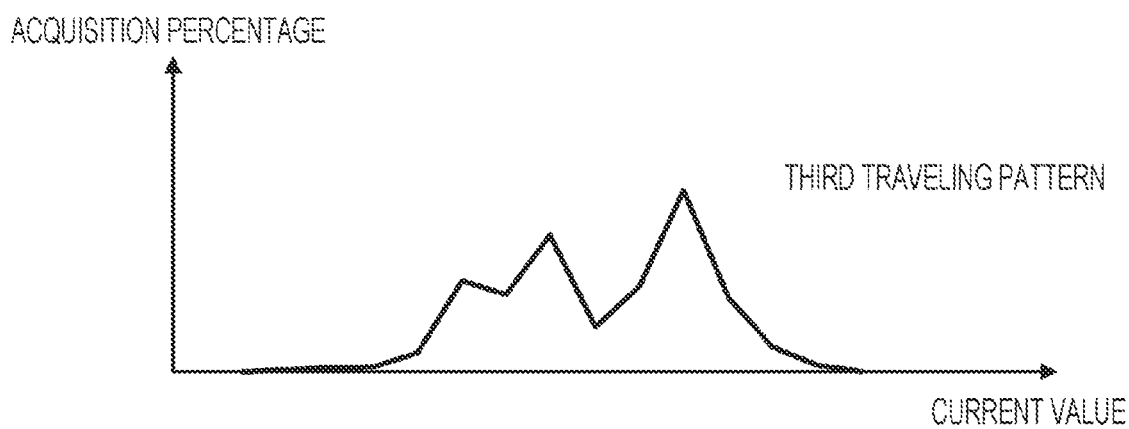
FIG. 6 is a diagram illustrating an example predetermined current-value percentage distribution in a case of traveling in a third traveling pattern.

FIG. 4 is a diagram illustrating an example of the predetermined current-value percentage distribution 42a in a case of traveling in the first traveling pattern. FIG. 5 is a diagram illustrating an example of the predetermined current-value percentage distribution 42b in a case of traveling in the second traveling pattern. FIG. 6 is a diagram illustrating an example of the predetermined current-value percentage distribution 42c in a case of traveling in the third traveling pattern.

When FIG. 4 to FIG. 6 are compared with each other, it is found that in the predetermined current-value percentage distribution 42a corresponding to the first traveling pattern, the acquisition percentages for classes around the center are higher than those in the predetermined current-value percentage distributions corresponding to the other traveling patterns. In the predetermined current-value percentage distribution 42b corresponding to the second traveling pattern, compared with the predetermined current-value percentage distributions corresponding to the other traveling patterns, current values spread over classes for which the absolute values of the current values are larger. In the predetermined current-value percentage distribution 42c corresponding to the third traveling pattern, unlike the predetermined current-value percentage distributions corresponding to the other traveling patterns, a peak of the acquisition percentage appears in a class higher than classes around the center. Accordingly, the characteristics of the predetermined current-value percentage distributions differ from traveling pattern to traveling pattern.

In the first embodiment, the predetermined current-value percentage distributions 42 corresponding to the respective traveling patterns are combined to thereby make a current-value percentage distribution acquired as a result of combining close to the actual current-value percentage distribution 40 acquired on the basis of actual driving. That is, the actual current-value percentage distribution 40 is represented by the combination of the plurality of predetermined current-value percentage distributions 42. Accordingly, a driving history for a driving period during which driving has been actually performed is associated with the combination of the plurality of traveling patterns. The driving history indicates, for example, acceleration and deceleration taking place over time.

When the actual current-value percentage distribution 40 is represented by the combination of the plurality of predetermined current-value percentage distributions 42, the percentage of each of the predetermined current-value percentage distributions 42 may be hereinafter called a traveling pattern percentage. The traveling pattern percentage of each of the traveling patterns is 100% or less, and the sum total of the traveling pattern percentages of all traveling patterns is equal to 100%. Each traveling pattern percentage indicates the degree of contribution of the traveling pattern to the actual driving history. As a traveling pattern percentage increases, the traveling pattern contributes to a larger degree, and as a traveling pattern percentage decreases, the traveling pattern contributes to a smaller degree.

The traveling pattern percentage deriver 36 derives the traveling pattern percentages of the respective traveling patterns on the basis of the actual current-value percentage distribution 40 and the predetermined current-value percentage distributions 42 corresponding to the respective traveling patterns.

FIG. 7 is a diagram for describing deriving of traveling pattern percentages. The traveling pattern percentage deriver 36 derives a combined current-value percentage distribution acquired by combining the predetermined current-value percentage distribution 42a corresponding to the first traveling pattern, the predetermined current-value percentage distribution 42b corresponding to the second traveling pattern, and the predetermined current-value percentage distribution 42c corresponding to the third traveling pattern.

Here, an m-th class is the m-th highest class of the current value. $X_m$ denotes the acquisition percentage for the m-th class in the predetermined current-value percentage distribution 42a corresponding to the first traveling pattern. $Y_m$ denotes the acquisition percentage for the m-th class in the predetermined current-value percentage distribution 42b corresponding to the second traveling pattern. $Z_m$ denotes the acquisition percentage for the m-th class in the predetermined current-value percentage distribution 42c corresponding to the third traveling pattern.

$W_1$ denotes a first traveling pattern percentage that is the traveling pattern percentage of the first traveling pattern. The first traveling pattern percentage corresponds to a first weighting factor by which each acquisition percentage in the predetermined current-value percentage distribution 42a corresponding to the first traveling pattern is multiplied. W2 denotes a second traveling pattern percentage that is the traveling pattern percentage of the second traveling pattern. The second traveling pattern percentage corresponds to a second weighting factor by which each acquisition percentage in the predetermined current-value percentage distribution 42b corresponding to the second traveling pattern is multiplied. W3 denotes a third traveling pattern percentage that is the traveling pattern percentage of the third traveling pattern. The third traveling pattern percentage corresponds to a third weighting factor by which each acquisition percentage in the predetermined current-value percentage distribution 42c corresponding to the third traveling pattern is multiplied. Therefore, the sum total of W1, W2, and W3 is equal to 100%.

Qm denotes the combined acquisition percentage for the m-th class in the combined current-value percentage distribution. Qm is derived by using expression (1) below. That is, the combined acquisition percentage indicates an acquisition percentage calculated for each class by adding up the acquisition percentages, for the class, in the plurality of predetermined current-value percentage distributions, each of the acquisition percentages being multiplied by a corresponding one of the traveling pattern percentages. The traveling pattern percentage deriver 36 derives the combined acquisition percentage for every class.

$$Qm = Xm \times W1 + Ym \times W2 + Zm \times W3 \quad (1)$$

The solid line A10 in FIG. 7 represents an example of the combined current-value percentage distribution and the dashed line A20 in FIG. 7 represents an example of the actual current-value percentage distribution 40. Pm denotes the acquisition percentage for the m-th class in the actual current-value percentage distribution 40.

Rm denotes an acquisition percentage difference for the m-th class. Rm is derived by using expression (2) below. That is, the acquisition percentage difference for the m-th class is the difference between the acquisition percentage for the m-th class in the actual current-value percentage distribution 40 and the combined acquisition percentage for the m-th class in the combined current-value percentage distribution. The traveling pattern percentage deriver 36 derives the acquisition percentage difference for every class.

$$Rm = Pm - Qm \quad (2)$$

The traveling pattern percentage deriver 36 derives the first traveling pattern percentage, the second traveling pattern percentage, and the third traveling pattern percentage with which the sum calculated by adding up the squares of the acquisition percentage differences for the plurality of classes is minimized.

Note that the traveling pattern percentage deriver 36 may derive the traveling pattern percentages with other existing calculation methods instead of the least squares method with which the traveling pattern percentages are derived as described above. That is, the traveling pattern percentage deriver 36 may derive the traveling pattern percentages with which the acquisition percentage difference for each class decreases.

Figure 8:
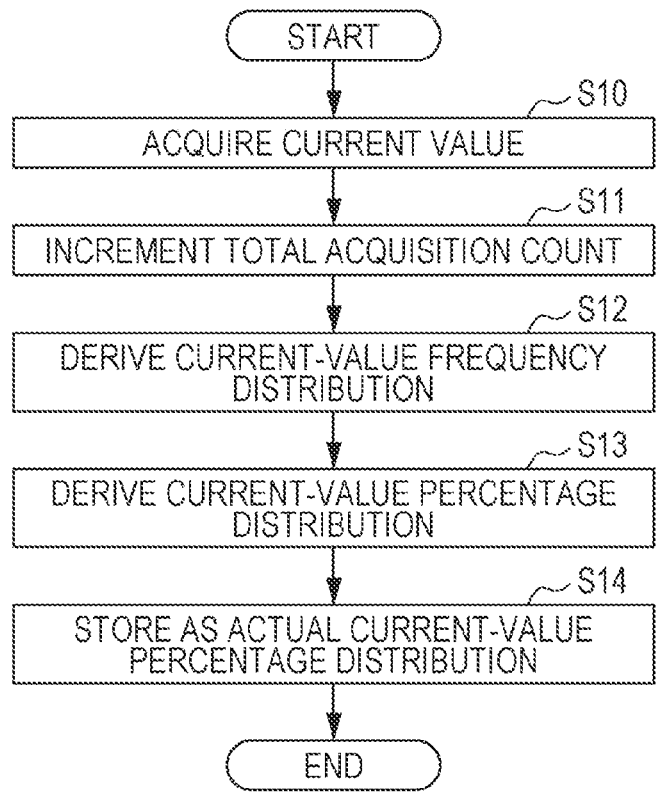
FIG. 8 is a flowchart for describing a flow of deriving an actual current-value percentage distribution.

FIG. 8 is a flowchart for describing a flow of deriving the actual current-value percentage distribution 40. When a current-value acquisition start condition is satisfied, the vehicle controller 20 periodically repeats the series of processes in FIG. 8 until a current-value acquisition end condition is satisfied. The current-value acquisition start condition is a condition that, for example, the vehicle 1 starts traveling and a change in current is detected. The current-value acquisition end condition is a condition that, for example, the vehicle 1 stops and a predetermined time elapses since the time when a change in current does not occur any more. Note that the current-value acquisition start condition and the current-value acquisition end condition are not limited to the example conditions described above and may be set as appropriate. The period from when the current-value acquisition start condition is satisfied to when the current-value acquisition end condition is satisfied corresponds to a predetermined driving period. Although the series of processes is repeated at intervals of, for example, 10 ms, the intervals are not limited to this example and may be set as appropriate.

At the timing when the series of processes is to be started, the current-value acquirer 30 acquires the current value of the battery 10 via the current detector 14 (S10). The acquired current value is accumulated in the storage 22. Next, the current-value acquirer 30 increments the total current-value acquisition count (S11). When the current-value acquisition end condition is satisfied, acquisition of the current value ends and the total current-value acquisition count is reset to an initial value.

Next, the current-value frequency distribution deriver 32 increments the acquisition count for a class to which the acquired current value belongs to thereby derive a current-value frequency distribution (S12). The derived current-value frequency distribution is stored in the storage 22. In a case where the process in step S12 is performed for the second or subsequent time in the driving period, the current-value frequency distribution deriver 32 increments the acquisition count for the current-value frequency distribution stored immediately before repetition to thereby update the current-value frequency distribution.

Next, the current-value percentage distribution deriver divides the acquisition count in the current-value frequency distribution derived in step S11 by the total acquisition count to thereby transform the acquisition count to an acquisition percentage, and derives a current-value percentage distribution (S13). The current-value percentage distribution deriver 34 stores the derived current-value percentage distribution in the storage 22 as the actual current-value percentage distribution 40 (S14), and the series of processes ends. In a case where the processes in step S13 and step S14 are performed for the second or subsequent time in the driving period, the actual current-value percentage distribution 40 is updated.

Figure 9:
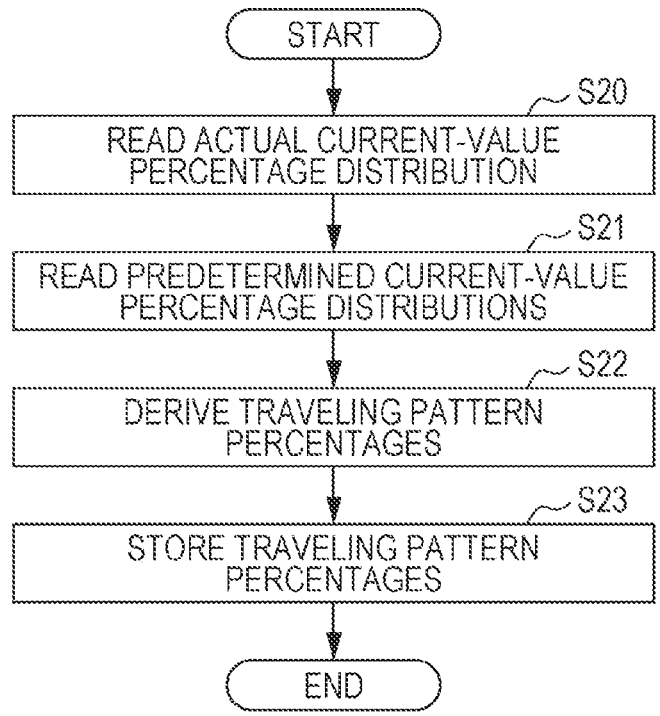
FIG. 9 is a flowchart for describing a flow of deriving traveling pattern percentages.

FIG. 9 is a flowchart for describing a flow of deriving traveling pattern percentages. When a deriving start condition for traveling pattern percentages is satisfied, the traveling pattern percentage deriver 36 performs the series of processes in FIG. 9. Although the deriving start condition for traveling pattern percentages is a condition that, for example, IG-OFF is detected, the deriving start condition is not limited to this example. For example, the deriving start condition for traveling pattern percentages may be considered to be satisfied in response to detection of a predetermined operation of giving an instruction for starting deriving of traveling pattern percentages.

The traveling pattern percentage deriver 36 first reads from the storage 22 the actual current-value percentage distribution 40 derived previously (S20). Next, the traveling pattern percentage deriver 36 reads from the storage 22 the predetermined current-value percentage distributions 42 stored in advance (S21).

Next, the traveling pattern percentage deriver 36 derives the traveling pattern percentages of the respective traveling patterns on the basis of the actual current-value percentage distribution 40 and the predetermined current-value percentage distributions 42 (S22). For example, the traveling pattern percentage deriver 36 multiples the acquisition percentages in each of the predetermined current-value percentage distributions 42 by a corresponding one of the traveling pattern percentages. The traveling pattern percentage deriver 36 calculates a combined acquisition percentage that is an acquisition percentage calculated for each class by adding up the acquisition percentages, for the class, in the plurality of predetermined current-value percentage distributions 42, each of the acquisition percentages being multiplied by a corresponding one of the traveling pattern percentages. The traveling pattern percentage deriver 36 calculates the difference between each acquisition percentage in the actual current-value percentage distribution 40 and a corresponding combined acquisition percentage as an acquisition percentage difference. The traveling pattern percentage deriver 36 derives the traveling pattern percentages of the respective traveling patterns with which the sum calculated by adding up the squares of the acquisition percentage differences for all classes is minimized.

Next, the traveling pattern percentage deriver 36 stores the traveling pattern percentages derived for the respective traveling patterns in the storage 22 (S23), and the series of processes ends.

As described above, in the vehicle 1 according to the first embodiment, the traveling pattern percentages are derived on the basis of the actual current-value percentage distribution 40 and the predetermined current-value percentage distributions 42. Accordingly, it can be supposed that the vehicle 1 according to the first embodiment has traveled in the first traveling pattern for the first traveling pattern percentage, has traveled in the second traveling pattern for the second traveling pattern percentage, and has traveled in the third traveling pattern for the third traveling pattern percentage. As a result, with the vehicle 1 according to the first embodiment, it is possible to grasp the ratios between the characteristic traveling patterns included in the driving history for the driving period.

For example, it is assumed that various parameters related to driving of the vehicle 1 are prepared in advance for each traveling pattern. Then, with the vehicle 1 according to the first embodiment, various parameters during actual driving can be estimated on the basis of the various parameters prepared in advance for each traveling pattern and the derived traveling pattern percentages. With the vehicle 1 according to the first embodiment, parameters that are difficult to be directly derived during actual driving can be indirectly derived by using the derived traveling pattern percentages. That is, as long as various parameters are prepared in advance at the time of development of the vehicle 1, various parameters can be easily estimated at the time of mass production of the vehicle 1 by deriving and using the traveling pattern percentages.

Therefore, with the vehicle 1 of the first embodiment, parameters related to the vehicle can be easily estimated.

Second Embodiment

Figure 10:
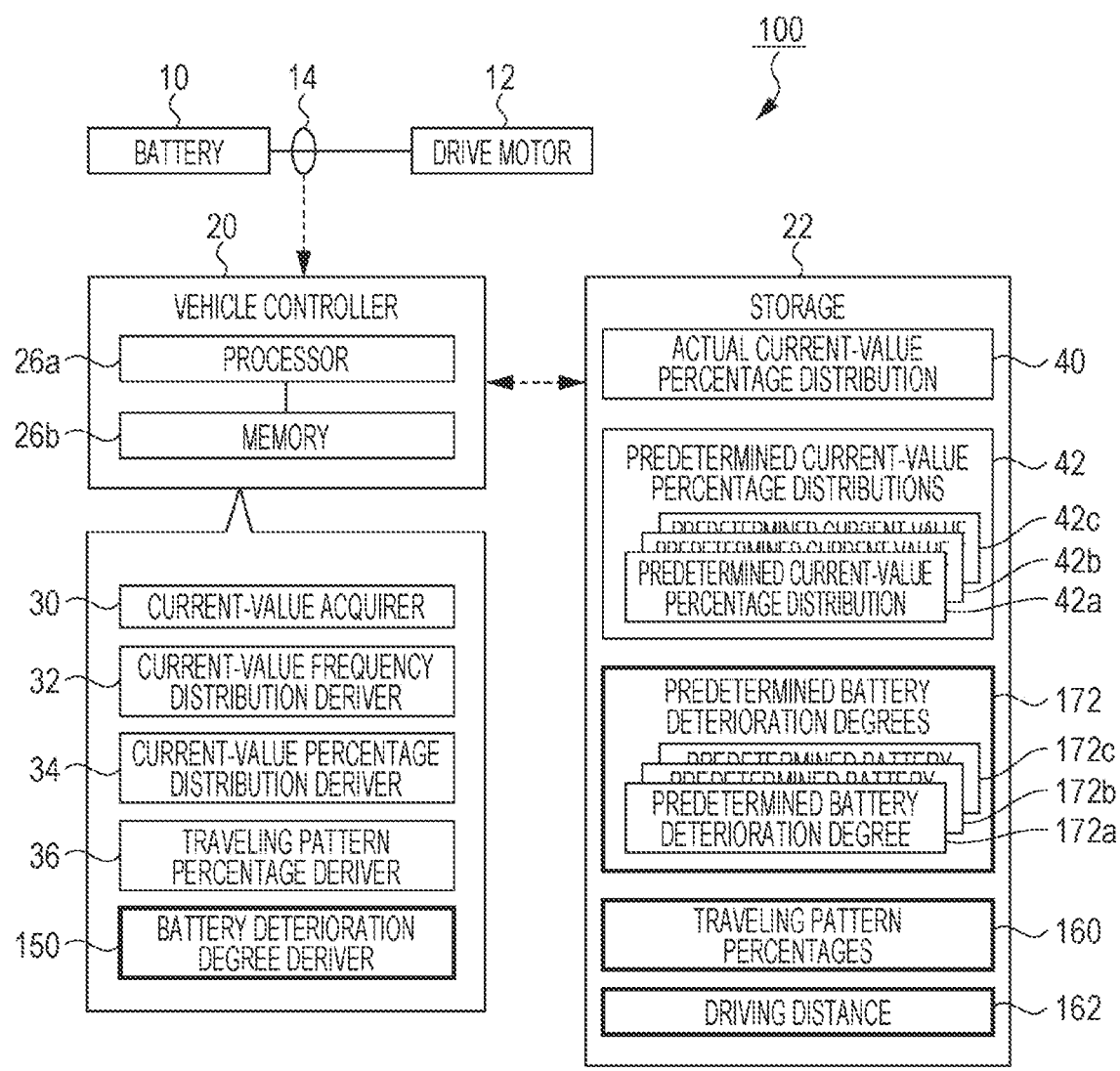
FIG. 10 is a schematic diagram illustrating a configuration of a vehicle according to an embodiment.

In a second embodiment, an example of using the traveling pattern percentages derived in the first embodiment will be described. FIG. 10 is a schematic diagram illustrating a configuration of a vehicle 100 according to the second embodiment.

The vehicle controller 20 of the vehicle 100 according to the second embodiment has the functions described in the first embodiment and also functions as a battery deterioration degree deriver 150. The battery deterioration degree deriver 150 will be described in detail below.

A battery deterioration degree indicates the amount of decrease in the SOH of the battery 10. The SOH indicates the percentage of the current full charging capacity where the initial full charging capacity is assumed to be 100%. The SOH decreases as the battery 10 deteriorates. The battery deterioration degree for a predetermined period is the difference between the SOH at the start of the predetermined period and the SOH at the end of the predetermined period. For example, in a case where the SOH changes from 99% to 98% over a predetermined period, the battery deterioration degree for this predetermined period is 1%. That is, the battery deterioration degree is an indicator that indicates the degree of deterioration of the battery 10 for a predetermined period.

In the storage 22 of the vehicle 100 according to the second embodiment, the predetermined current-value percentage distributions 42 are stored in advance and the derived actual current-value percentage distribution 40 is also stored as in the first embodiment. In the storage 22 according to the second embodiment, traveling pattern percentages 160 derived by the traveling pattern percentage deriver 36 are stored. Further, in the storage 22 according to the second embodiment, a driving distance 162 during a driving period for which the traveling pattern percentages have been derived is stored.

Further, in the storage 22, predetermined battery deterioration degrees 172 are stored. Each of the predetermined battery deterioration degrees 172 indicates a battery deterioration degree in a case of traveling a predetermined distance set in advance in a corresponding one of the traveling patterns. In the storage 22, each of the predetermined battery deterioration degrees 172 is associated with a corresponding one of the plurality of traveling patterns and stored. Although the predetermined distance is, for example, 10000 km, the predetermined distance is not limited to this example and may be set as appropriate. In the storage 22, for example, a predetermined battery deterioration degree 172a in a case of traveling 10000 km in the first traveling pattern, a predetermined battery deterioration degree 172b in a case of traveling 10000 km in the second traveling pattern, and a predetermined battery deterioration degree 172c in a case of traveling 10000 km in the third traveling pattern are stored.

FIG. 11 is a diagram illustrating examples of the predetermined battery deterioration degrees 172. In the examples illustrated in FIG. 11, the predetermined battery deterioration degree 172a for 10000 km in the first traveling pattern is 0.25%, the predetermined battery deterioration degree 172b for 10000 km in the second traveling pattern is 0.55%, and the predetermined battery deterioration degree 172c for 10000 km in the third traveling pattern is 0.4%. Accordingly, the predetermined battery deterioration degrees differ from traveling pattern to traveling pattern.

The battery deterioration degree deriver 150 derives, on the basis of the driving distance 162 during a driving period in which driving has been actually performed, the traveling pattern percentages 160 derived for the driving period, and the predetermined battery deterioration degrees 172 stored in advance, a battery deterioration degree resulting from driving for the driving period.

FIG. 12 is a diagram for describing deriving of a battery deterioration degree by the battery deterioration degree deriver 150. In the example illustrated in FIG. 12, it is assumed that the first traveling pattern percentage is 30%, the second traveling pattern percentage is 60%, and the third traveling pattern percentage is 10%.

For example, it is assumed that the driving distance 162 during the actual driving period is 20 km. In this case, the first traveling pattern percentage is 30%, and therefore, of 20 km, a driving distance to which the first traveling pattern contributes is 6 km (20 km×0.3=6 km). The second traveling pattern percentage is 60%, and therefore, of 20 km, a driving distance to which the second traveling pattern contributes is 12 km (20 km×0.6=12 km). The third traveling pattern percentage is 10%, and therefore, of 20 km, a driving distance to which the third traveling pattern contributes is 2 km (20 km×0.1=2 km).

The predetermined battery deterioration degree for 10000 km in the first traveling pattern is 0.25%, and therefore, the battery deterioration degree in a case of driving 6 km in the first traveling pattern is 0.00015% (0.25%×6 km/10000 km=0.00015%). The predetermined battery deterioration degree for 10000 km in the second traveling pattern is 0.55%, and therefore, the battery deterioration degree in a case of driving 12 km in the second traveling pattern is 0.00066% (0.55%×12 km/10000 km=0.00066%). The predetermined battery deterioration degree for 10000 km in the third traveling pattern is 0.4%, and therefore, the battery deterioration degree in a case of driving 2 km in the third traveling pattern is 0.00008% (0.4%×2 km/10000 km=0.00008%).

That is, the battery deterioration degree deriver 150 divides the driving distance 162 into sectional driving distances corresponding to the respective traveling patterns and derives the actual battery deterioration degree for each traveling pattern on the basis of the sectional driving distances and the predetermined battery deterioration degrees 172. Hereinafter, the actual battery deterioration degree for each traveling pattern may be called a sectional battery deterioration degree.

The battery deterioration degree deriver 150 adds up the derived sectional battery deterioration degrees for the plurality of traveling patterns to derive the battery deterioration degree for the actual driving distance. In the example illustrated in FIG. 12, the battery deterioration degree in a case of driving 20 km is 0.00089% (0.00015%+0.00066%+0.00008%=0.000890).

Figure 13:
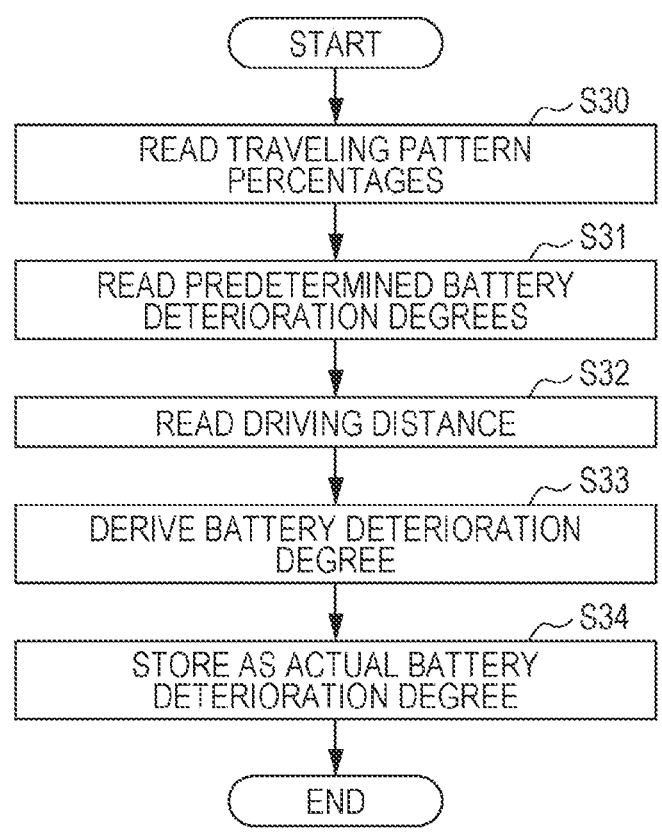
FIG. 13 is a flowchart for describing a flow of deriving a battery deterioration degree by the battery deterioration degree deriver.

FIG. 13 is a flowchart for describing a flow of deriving the battery deterioration degree by the battery deterioration degree deriver 150. When a deriving start condition for a battery deterioration degree is satisfied, the battery deterioration degree deriver 150 performs the series of processes in FIG. 13. Although the deriving start condition for a battery deterioration degree is a condition that, for example, deriving of the traveling pattern percentages 160 by the traveling pattern percentage deriver 36 is completed, the deriving start condition is not limited to this example. For example, the deriving start condition for a battery deterioration degree may be considered to be satisfied in response to detection of a predetermined operation of giving an instruction for starting deriving of a battery deterioration degree. In this case, in a case where the traveling pattern percentages 160 are not yet derived, the traveling pattern percentages 160 are derived first, and thereafter, the series of processes in FIG. 13 is performed.

The battery deterioration degree deriver 150 first reads from the storage 22 the traveling pattern percentages 160 derived previously (S30). Next, the battery deterioration degree deriver 150 reads from the storage 22 the predetermined battery deterioration degrees 172 stored in advance (S31). Next, the battery deterioration degree deriver 150 reads from the storage 22 the driving distance 162 during a driving period for which the traveling pattern percentages 160 have been derived (S32).

Next, the battery deterioration degree deriver 150 derives, on the basis of the driving distance 162 during the driving period, the traveling pattern percentages 160 for the driving period, and the predetermined battery deterioration degrees 172, the battery deterioration degree for the driving distance 162 (S33). For example, the battery deterioration degree deriver 150 multiplies the actual driving distance 162 by each of the traveling pattern percentages and a corresponding one of the predetermined battery deterioration degrees 172 to thereby derive a sectional battery deterioration degree for a corresponding one of the traveling patterns. The battery deterioration degree deriver 150 adds up the sectional battery deterioration degrees for the plurality of traveling patterns to thereby derive the battery deterioration degree for the driving distance 162.

Next, the battery deterioration degree deriver 150 stores the derived battery deterioration degree in the storage 22 as an actual battery deterioration degree (S34), and the series of processes ends.

As described above, in the vehicle 100 according to the second embodiment, the derived traveling pattern percentages 160 are used to derive the battery deterioration degree for the actual driving distance. That is, with the vehicle 100 according to the second embodiment, the battery deterioration degree that is difficult to be directly derived during actual driving can be estimated by using the traveling pattern percentages 160.

Although the battery deterioration degree is derived by using the traveling pattern percentages 160 in the second embodiment, the traveling pattern percentages 160 may be used in other than deriving of the battery deterioration degree. For example, it is assumed that the vehicle 100 is a hybrid electric vehicle including an engine. It is assumed that in the storage 22, each traveling pattern among the plurality of traveling patterns is associated with the amount of exhaust gas in a case of traveling a predetermined distance in the traveling pattern and stored in advance. Then, the vehicle controller 20 may derive the amount of exhaust gas for an actual driving distance on the basis of the traveling pattern percentages 160 for the driving period and the amount of exhaust gas for each traveling pattern stored in advance. With this form, the amount of exhaust gas that is difficult to be directly derived during actual driving can be estimated.

Third Embodiment

Figure 14:
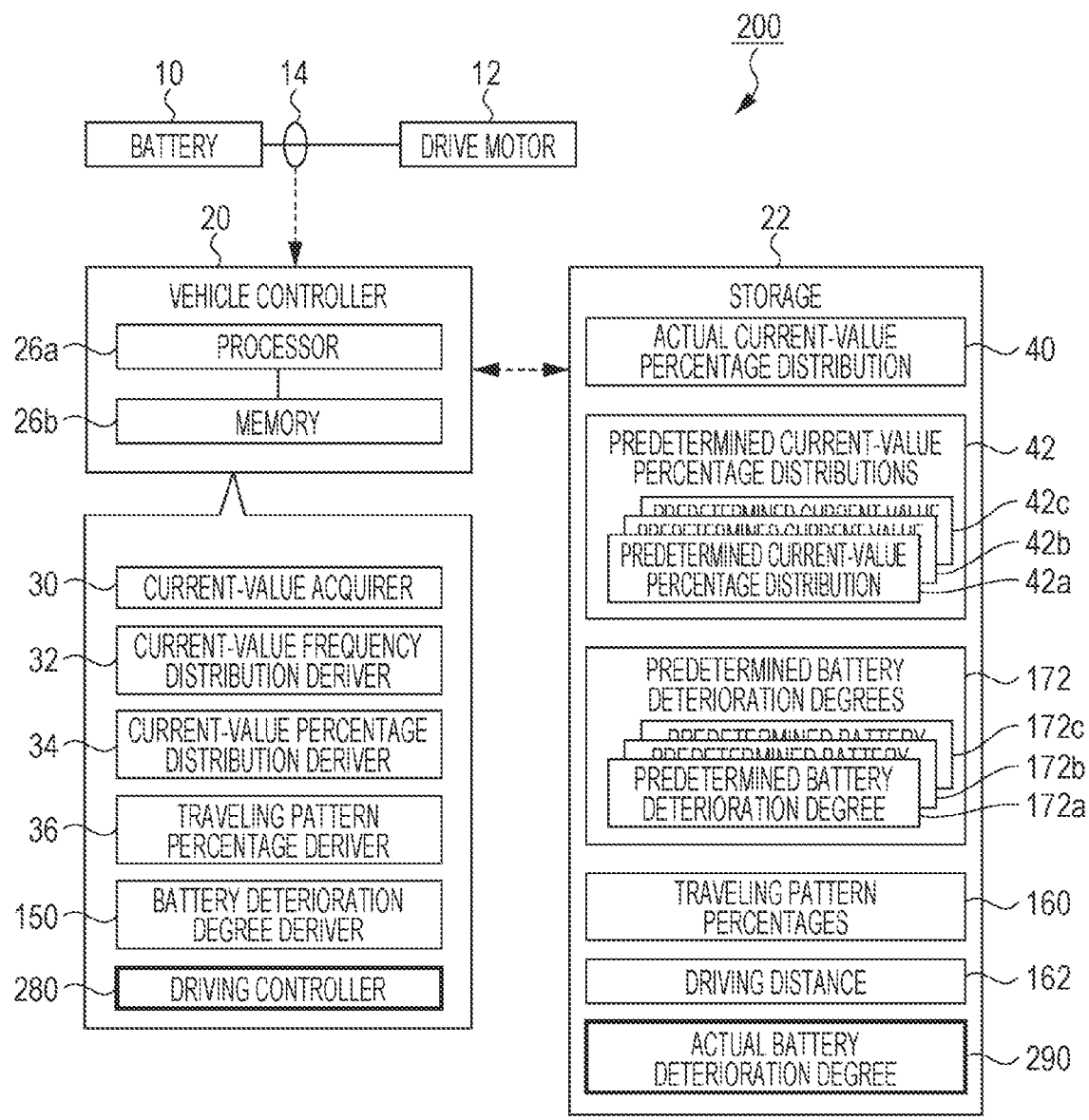
FIG. 14 is a schematic diagram illustrating a configuration of a vehicle according to an embodiment.

In a third embodiment, an example of using the battery deterioration degree derived in the second embodiment will be described. FIG. 14 is a schematic diagram illustrating a configuration of a vehicle 200 according to the third embodiment. The vehicle controller 20 of the vehicle 200 according to the third embodiment has the functions described in the second embodiment and also functions as a driving controller 280. The driving controller 280 will be described in detail below.

In the storage 22 of the vehicle 200 according to the third embodiment, the battery deterioration degree derived by the battery deterioration degree deriver 150 is stored as an actual battery deterioration degree 290 in addition to the contents described in the second embodiment.

The actual current-value percentage distribution 40 based on actual driving differs depending on the details of the actual driving history. Therefore, the traveling pattern percentages 160 and the actual battery deterioration degree 290 differ depending on the details of the actual driving history. Accordingly, the actual battery deterioration degree 290 may increase depending on the details of the actual driving history.

The traveling pattern percentage deriver 36 according to the third embodiment intentionally changes the actual current-value percentage distribution 40 and derives new traveling pattern percentages with which the battery deterioration degree becomes smaller than the actual battery deterioration degree 290. The driving controller 280 according to the third embodiment assists the driver in driving the vehicle 200 on the basis of the newly derived traveling pattern percentages.

Figure 15:
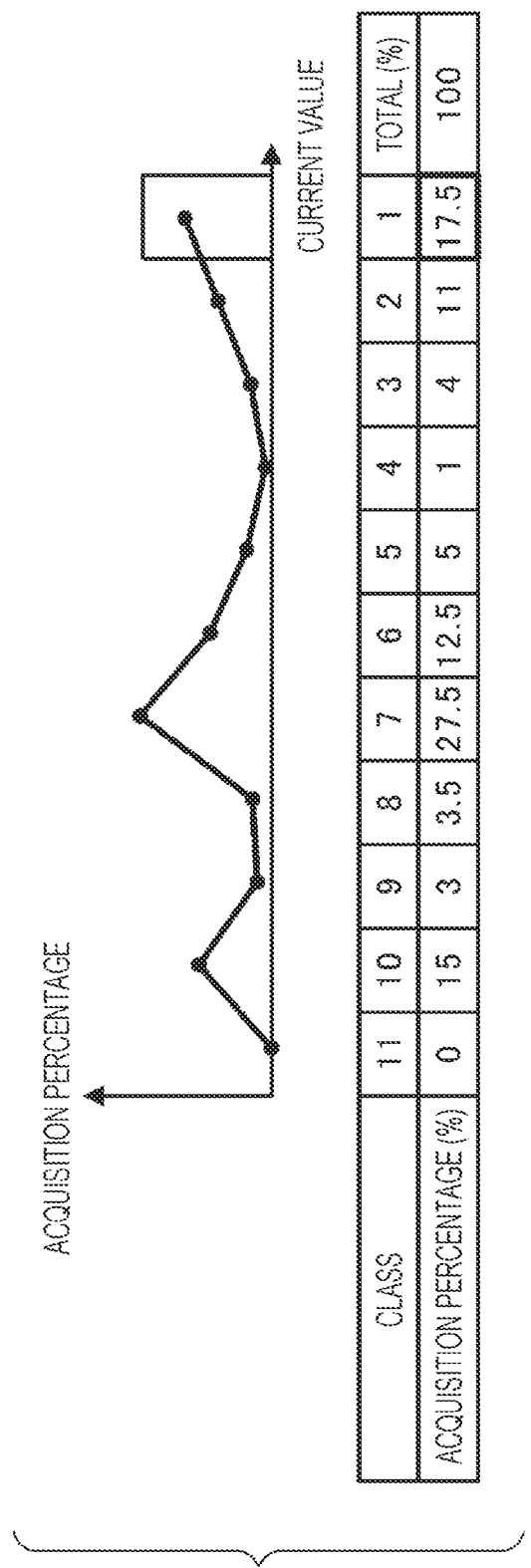
FIG. 15 is a diagram for describing changes in an actual current-value percentage distribution.
Figure 16:
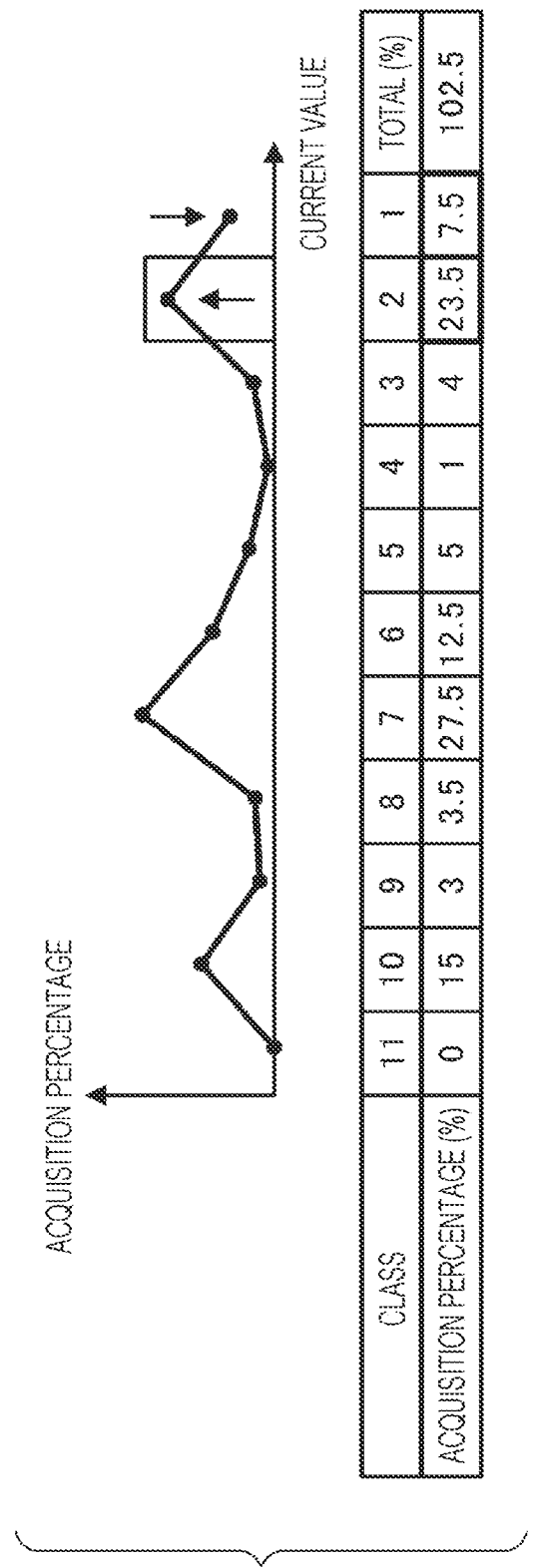
FIG. 16 is a diagram for describing changes in the actual current-value percentage distribution.
Figure 17:
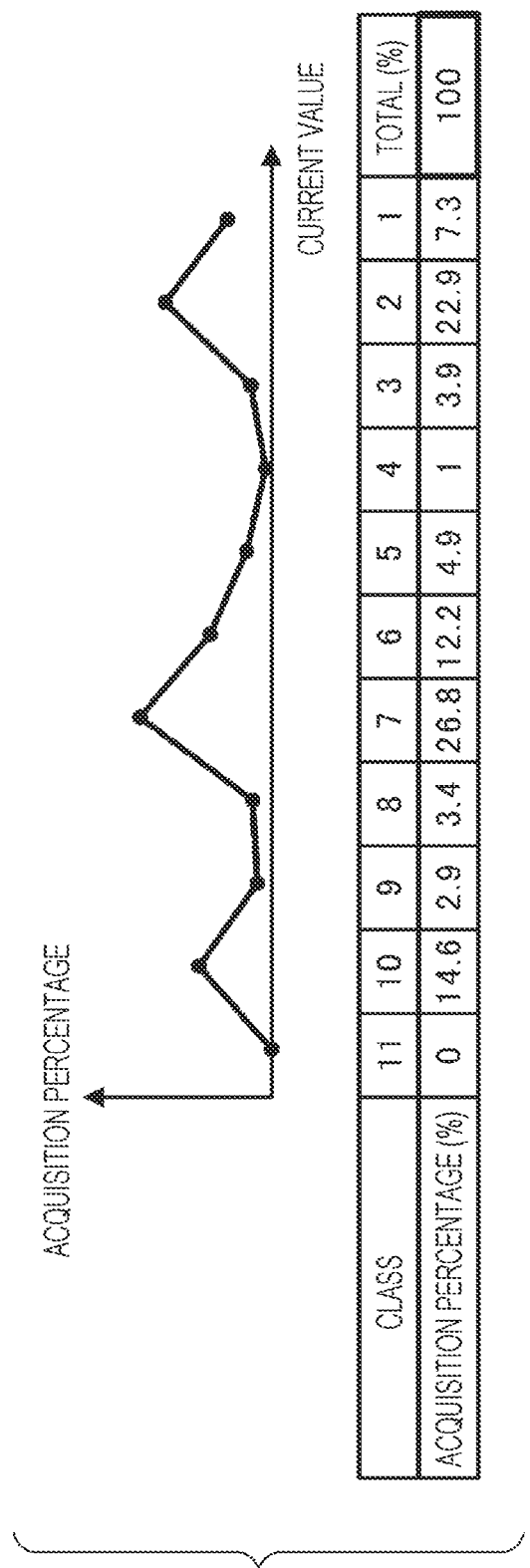
FIG. 17 is a diagram for describing changes in the actual current-value percentage distribution.

FIG. 15, FIG. 16, and FIG. 17 are diagrams for describing changes in the actual current-value percentage distribution 40. For example, it is assumed that the actual current-value percentage distribution 40 illustrated in FIG. 15 is acquired on the basis of actual driving.

The SOH is highly likely to decrease as the current value of the discharging current of the battery 10 increases. That is, in the actual current-value percentage distribution 40, if the acquisition percentage for a class corresponding to a higher current value can be decreased, it is highly likely that an increase in the battery deterioration degree can be suppressed.

The traveling pattern percentage deriver 36 according to the third embodiment attempts to decrease the acquisition percentage for the 1st class to which the highest current value in the current-value possible range belongs.

For example, the acquisition percentage for the 1st class in the actual current-value percentage distribution 40, which is 17.5% in FIG. 15, is decreased by 10% to 7.5% as illustrated in FIG. 16.

When only the acquisition percentage for the 1st class is decreased, the total acquisition percentage for all classes decreases to less than 100% by the decrease for the 1st class. Therefore, the traveling pattern percentage deriver 36 increases the acquisition percentage for the 2nd class in association with the decrease in the acquisition percentage for the 1st class as illustrated in FIG. 16.

The amount of increase in the acquisition percentage for the 2nd class is determined by using expression (3) below. Here, i1 denotes a representative current value in the 1st class. The representative current value in the 1st class is any current value determined from the range of current values in the 1st class. i2 denotes a representative current value in the 2nd class. The representative current value in the 2nd class is any current value determined from the range of current values in the 2nd class. f1 denotes the amount of decrease in the acquisition percentage for the 1st class. f2 denotes the amount of increase in the acquisition percentage for the 2nd class.

$$f2=f1\times(i1/i2) \qquad (3)$$

For example, it is assumed that the representative current value in the 1st class is 100 A, the representative current value in the 2nd class is 80 A, and the amount of decrease in the acquisition percentage for the 1st class is 10%. In this case, the amount of increase in the acquisition percentage for the 2nd class is 12.5% (10%×100 A/80 A=12.5%). When the amount of increase in the acquisition percentage for the 2nd class is thus determined, the total current value for the actual current-value percentage distribution 40 can be maintained.

The acquisition percentage for the 2nd class after increase is derived by adding the amount of increase in the acquisition percentage for the 2nd class derived by using expression (3) to the acquisition percentage for the 2nd class in the actual current-value percentage distribution 40. For example, the acquisition percentage for the 2nd class in the actual current-value percentage distribution 40, which is 11% in FIG. 15, is increased to 23.5% as illustrated in FIG. 16 by adding 12.5% derived by using expression (3).

When the acquisition percentage for the 1st class and the acquisition percentage for the 2nd class are thus changed, the total acquisition percentage for all classes might not be equal to 100% as illustrated in FIG. 16. In the example in FIG. 16, the total acquisition percentage is 102.5%. Therefore, the acquisition percentage for every class is adjusted as illustrated in FIG. 17 such that the total acquisition percentage is equal to 100%.

The acquisition percentage for the m-th class in the current-value percentage distribution after adjustment is determined by using expression (4) below. Here, PAm denotes the acquisition percentage for the m-th class in the current-value percentage distribution before adjustment. S denotes the total acquisition percentage before adjustment. PBm denotes the acquisition percentage for the m-th class in the current-value percentage distribution after adjustment.

$$PBm=PAm\times100/S \qquad (4)$$

For example, when the total acquisition percentage before adjustment is 102.5% and the acquisition percentage for the 5th class before adjustment is 5% as illustrated in FIG. 16, the acquisition percentage for the 5th class after adjustment is 4.9% (5%×100%/102.5%=4.9%) as illustrated in FIG. 17. Although, for example, the 5th class has been described, transformation as described above is performed for the acquisition percentage for every class.

The traveling pattern percentage deriver 36 thus decreases the acquisition percentage for the 1st class and increases the acquisition percentage for the 2nd class to thereby change the actual current-value percentage distribution 40. The traveling pattern percentage deriver 36 derives the traveling pattern percentages on the basis of the changed actual current-value percentage distribution. The battery deterioration degree deriver 150 derives the battery deterioration degree for the changed actual current-value percentage distribution on the basis of the derived traveling pattern percentages. The traveling pattern percentage deriver 36 changes the amount of decrease in the acquisition percentage for the 1st class to thereby identify the actual current-value percentage distribution after change with which the battery deterioration degree becomes smaller than that before change and identify new traveling pattern percentages on the basis of the identified actual current-value percentage distribution.

Although the acquisition percentage for the 2nd class is increased in FIG. 16 in association with a decrease in the acquisition percentage for the 1st class, for example, the acquisition percentage for any class other than the 1st class may be increased instead of increasing the acquisition percentage for the 2nd class.

Figure 18:
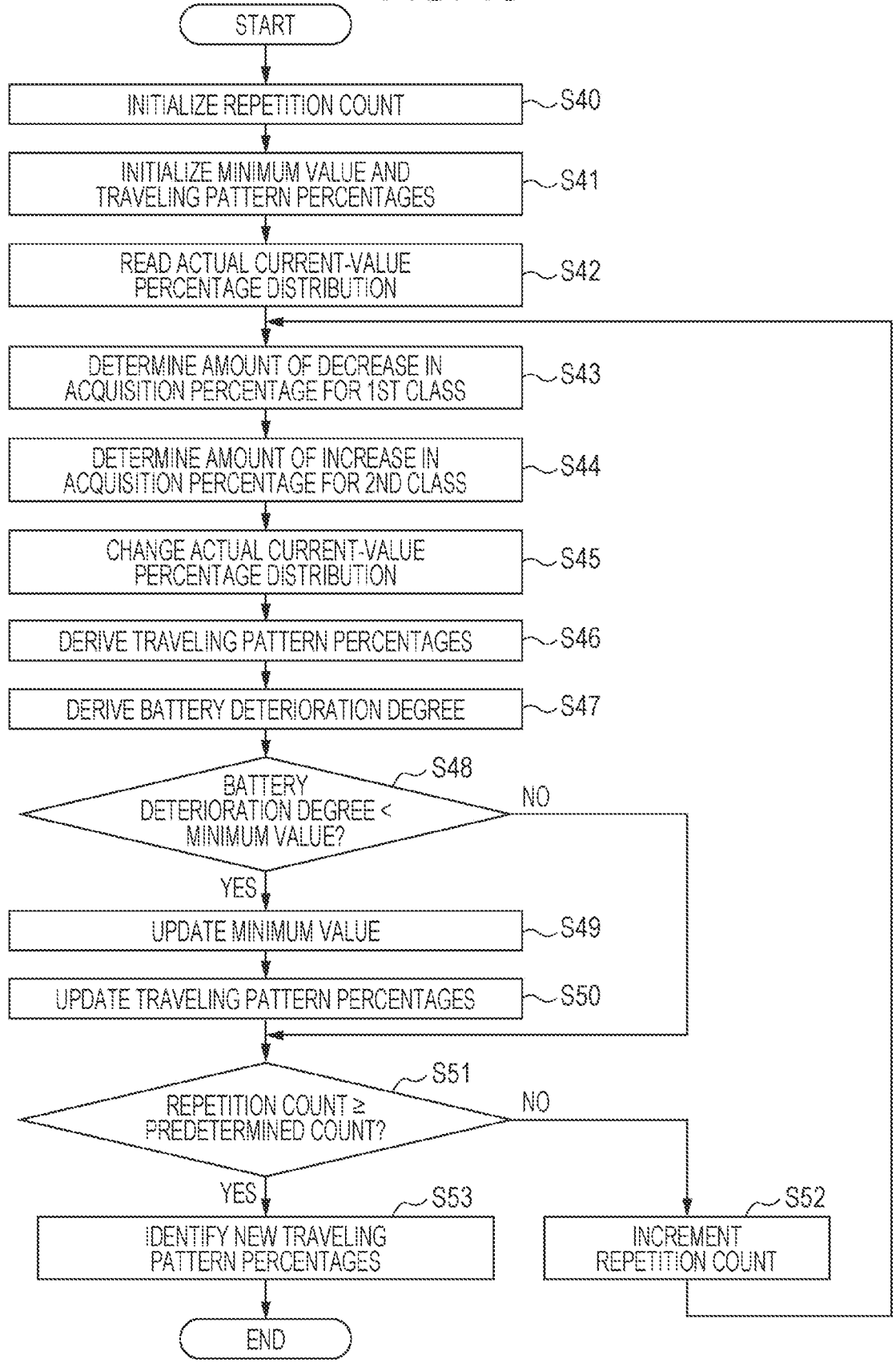
FIG. 18 is a flowchart for describing a flow of operations of a vehicle controller according to the embodiment.

FIG. 18 is a flowchart for describing a flow of operations of the vehicle controller 20 according to the third embodiment. When a condition for starting identification of new traveling pattern percentages is satisfied, the vehicle controller 20 performs the series of processes in FIG. 18. Although the condition for starting identification of new traveling pattern percentages is a condition that, for example, deriving of the traveling pattern percentages 160 for an actual driving period is completed and deriving of the actual battery deterioration degree 290 for the driving period is completed, the condition is not limited to this example.

The traveling pattern percentage deriver 36 first initializes a repetition count (S40). The repetition count indicates the number of times the actual current-value percentage distribution 40 is changed, which will be described below. In step S40, for example, the traveling pattern percentage deriver 36 resets the repetition count to zero.

Next, the traveling pattern percentage deriver 36 initializes the minimum value of the battery deterioration degree and initializes the traveling pattern percentages (S41). In step S41, for example, the traveling pattern percentage deriver 36 sets the actual battery deterioration degree 290 stored in the storage 22 as the minimum value of the battery deterioration degree and sets the traveling pattern percentages 160 stored in the storage 22 as the initial values of the traveling pattern percentages.

Next, the traveling pattern percentage deriver 36 reads the actual current-value percentage distribution 40 from the storage 22 (S42).

Next, the traveling pattern percentage deriver 36 determines the amount of decrease in the acquisition percentage for the 1st class with reference to the acquisition percentage for the 1st class in the actual current-value percentage distribution 40 (S43). For example, the amount of decrease in the acquisition percentage for the 1st class is increased by a predetermined acquisition percentage, such as 10%, each time the repetition count is incremented. Note that the predetermined acquisition percentage is not limited to 10% described above and may be set as appropriate.

Next, the traveling pattern percentage deriver 36 determines the amount of increase in the acquisition percentage for the 2nd class with reference to the acquisition percentage for the 2nd class in the actual current-value percentage distribution 40 (S44). The amount of increase in the acquisition percentage for the 2nd class is determined on the basis of the amount of decrease for the 1st class.

Next, the traveling pattern percentage deriver 36 decreases the acquisition percentage for the 1st class in the actual current-value percentage distribution 40 and increases the acquisition percentage for the 2nd class in the actual current-value percentage distribution 40 to thereby change the actual current-value percentage distribution 40 (S45). At this time, the traveling pattern percentage deriver 36 also adjusts the acquisition percentage for each class such that the total acquisition percentage is equal to 100%.

Next, the traveling pattern percentage deriver 36 derives the traveling pattern percentages on the basis of the actual current-value percentage distribution 40 after change (S46).

Next, the battery deterioration degree deriver 150 derives the battery deterioration degree for the actual current-value percentage distribution 40 after change on the basis of the traveling pattern percentages derived in step S46 (S47).

Next, the traveling pattern percentage deriver 36 determines whether the battery deterioration degree derived in step S47 is less than the minimum value (S48).

If the battery deterioration degree derived in step S47 is less than the minimum value (YES in S48), the traveling pattern percentage deriver 36 updates the minimum value with the battery deterioration degree derived in step S47 (S49). The traveling pattern percentage deriver 36 updates the traveling pattern percentages corresponding to the minimum value with the traveling pattern percentages derived in step S46 (S50), and the flow proceeds to the process in step S51.

If the battery deterioration degree derived in step S47 is greater than or equal to the minimum value (NO in S48), the traveling pattern percentage deriver 36 maintains the minimum value and the traveling pattern percentages, and the flow proceeds to the process in step S51.

In step S51, the traveling pattern percentage deriver 36 determines whether the repetition count is greater than or equal to a predetermined count (S51). Although the predetermined count is, for example, five, the predetermined count is not limited to this example and may be set to any number.

If the repetition count is less than the predetermined count (NO in S51), the traveling pattern percentage deriver 36 increments the repetition count (S52), and the flow returns to the process in step S43. The traveling pattern percentage deriver 36 increases the amount of decrease in the acquisition percentage for the 1st class step by step and repeats the processes in step S43 and the subsequent steps.

If the repetition count is greater than or equal to the predetermined count (YES in S51), the traveling pattern percentage deriver 36 identifies the traveling pattern percentages corresponding to the minimum value as new traveling pattern percentages (S53), and the series of processes ends.

As described above, in the vehicle 200 according to the third embodiment, the actual current-value percentage distribution 40 is changed, and new traveling pattern percentages are identified on the basis of the actual current-value percentage distribution after change with which the battery deterioration degree for the actual current-value percentage distribution 40 after change becomes smaller than that before change. Accordingly, with the vehicle 200 according to the third embodiment, it is possible to grasp a way of driving with which an increase in the battery deterioration degree can be suppressed.

After the new traveling pattern percentages are identified, the driving controller 280 puts a drive limitation on the vehicle 200 or presents advice regarding driving such that the vehicle 200 is driven in accordance with the identified new traveling pattern percentages.

For example, the driving controller 280 derives a limit value of the acceleration of the vehicle 200 on the basis of the new traveling pattern percentages. The driving controller 280 suppresses the output of the drive motor 12 in the next driving such that the acceleration of the vehicle 200 is less than or equal to the limit value. Accordingly, the appearance of a current value in the 1st class is suppressed, and the traveling pattern percentages in the driving history can be made closer to the new traveling pattern percentages. Therefore, with this form, an increase in the battery deterioration degree can be suppressed. Instead of suppressing the acceleration, for example, the driving controller 280 may derive a limit value of the speed of the vehicle 200 and suppress the output of the drive motor 12 such that the speed of the vehicle 200 is less than or equal to the limit value.

Further, for example, the driving controller 280 may display the limit value of the acceleration or the limit value of the speed derived on the basis of the new traveling pattern percentages, on the instrument panel or a display of a navigation device. In this case, the driving controller 280 might not suppress the output of the drive motor 12. When the limit value of the acceleration or the like is displayed, the driver can drive while intentionally suppressing the acceleration or the like. Accordingly, it is possible to encourage the driver to drive such that the appearance of a current value in the 1st class is suppressed, and an increase in the battery deterioration degree can be suppressed accordingly.

Although embodiments of the disclosure have been described above with reference to the attached drawings, the disclosure is not limited to the embodiments as a matter of course. It is obvious that the person skilled in the art can conceive of various modifications or corrections within the scope described in the claims, and it is understood that such modifications or corrections are also within the technical scope of the disclosure as a matter of course.

The invention claimed is:

1. A vehicle comprising:
a drive motor that is a drive source of the vehicle;
a battery coupled to the drive motor and configured to supply power to the drive motor;
a current detector configured to detect current values of the battery charged and discharged;
a storage configured to store predetermined current-value rate distributions that respectively represent current-value rate distributions in a case of traveling in traveling patterns set in advance, each traveling pattern among the traveling patterns being associated with a corresponding one of predetermined battery deterioration degrees that indicates an amount of decrease in a state of health of the battery in a case of traveling a predetermined distance in the traveling pattern;
at least one processor;
at least one memory coupled to the at least one processor and storing instructions for causing the at least one processor to:
store a current-value frequency distribution in the storage, the current-value frequency distribution representing a frequency distribution of acquisition counts of the current values for classes, the current-value frequency distribution including the classes into which a possible range of the current values are divided;
in response to detection of a start of a predetermined period, acquire the current values of the battery charged and discharged, via the current detector, each of the current values each time a predetermined time elapses during the predetermined period, the predetermined period including a period when the vehicle is traveling;
upon acquiring of each of the current values,
(1) store the newly acquired current values so that all the current values acquired during the predetermined period are stored in the storage,
(2) update current-value frequency distribution stored in the storage by incrementing a corresponding acquisition count that is one of the acquisition counts for one of the classes to which the newly acquired current values belong,
(3) transform the acquisition counts in the current-value frequency distribution for the predetermined period to acquisition rate, each of the acquisition rates indicating a rate of the each of the acquisition counts for the predetermined period to a total of the acquisition counts for the predetermined period,
(4) derive an actual current-value rate distribution that represents a distribution of the acquisition rates for the classes,
(5) store the actual current-value rate distribution in the storage; and
in response to detection of an end of the acquisition period,
(1) stop acquisition of the current values,
(2) read the actual current-value rate distribution and the predetermined current-value rate distributions from the storage,
(3) derive traveling pattern rates based on the actual current-value rate distribution and the predetermined current-value rate distributions, the traveling pattern rates indicating rates of the respective predetermined current-value rate distributions in a case where the actual current-value rate distribution is represented by a combination of the predetermined current-value rate distributions,
(4) store a driving distance of the vehicle during the predetermined period and the derived traveling pattern rates in the storage,
(5) read (i) the driving distance, (ii) the derived traveling pattern rates, and (iii) the predetermined battery deterioration degrees from the storage,
(6) derive a battery deterioration degree resulting from driving in the predetermined period based on (i) the driving distance, (ii) the derived traveling pattern rates, and (iii) the predetermined battery deterioration degrees, and
(7) store the derived battery deterioration degree in the storage.

2. The vehicle according to claim 1, wherein the at least one processor is configured to
multiply acquisition rates in each of the predetermined current-value rate distributions by a corresponding one of the traveling pattern rates,
calculate a combined acquisition rate that is an acquisition rate calculated for each of the classes by adding up the acquisition rates, for the each of the classes, in the predetermined current-value rate distributions, each of the acquisition rates being multiplied by a corresponding one of the traveling pattern rates,
calculate a difference between the combined acquisition rate for the each of the classes and a corresponding one of the acquisition rates in the actual current-value rate distribution as an acquisition rate difference, and
derive the traveling pattern rates with which the acquisition rate difference for the each of the classes becomes smaller.

3. The vehicle according to claim 1, wherein
the at least one processor is configured to:
derive sectional battery deterioration degrees that indicate actual battery deterioration degrees for the respective traveling patterns, each of the sectional battery deterioration degrees being calculated by multiplying the driving distance by a corresponding one of the traveling pattern rates and by a corresponding one of the predetermined battery deterioration degrees; and
derive the battery deterioration degree for the driving distance by adding up the sectional battery deterioration degrees for the traveling patterns.

4. The vehicle according to claim 2, wherein
the at least one processor is configured to:
derive sectional battery deterioration degrees that indicate actual battery deterioration degrees for the respective traveling patterns, each of the sectional battery deterioration degrees being calculated by multiplying the driving distance by a corresponding one of the traveling pattern rates and by a corresponding one of the predetermined battery deterioration degrees; and
derive the battery deterioration degree for the driving distance by adding up the sectional battery deterioration degrees for the traveling patterns.

5. The vehicle according to claim 3, wherein
the at least one processor is configured to change the actual current-value rate distribution into a changed actual current-value rate and to identify new traveling pattern rates on the basis of the changed actual current-value rate distribution with which the battery deterioration degree for the changed actual current-value rate distribution after change becomes smaller than the battery deterioration degree before the change.

6. The vehicle according to claim 4, wherein
the at least one processor is configured to change the actual current-value rate distribution into a changed actual current-value rate and to identify new traveling pattern rates on the basis of the changed actual current-value rate distribution after change with which the battery deterioration degree for the actual current-value rate distribution after change becomes smaller than the battery deterioration degree before the change.

7. The vehicle according to claim 5, further comprising a driving controller configured to, after identification of the new traveling pattern rates, put a drive limitation on an output of the drive motor such that the vehicle is driven in accordance with the new traveling pattern rate.

8. The vehicle according to claim 6, further comprising a driving controller configured to, after identification of the new traveling pattern rates, put a drive limitation on an output of the drive motor such that the vehicle is driven in accordance with the new traveling pattern rates.

9. A vehicle comprising:
a drive motor that is a drive source of the vehicle;
a battery coupled to the drive motor and configured to supply power to the drive motor;
a current detector configured to detect current values of the battery charged and discharged;
a storage configured to store predetermined current-value rate distributions that respectively represent current-value rate distributions in a case of traveling in traveling patterns set in advance, each traveling pattern among the traveling patterns being associated with a corresponding one of predetermined battery deterioration degrees that indicates an amount of decrease in a state of health of the battery in a case of traveling a predetermined distance in the traveling pattern;
at least one processor; and
at least one memory coupled to the at least one processor and storing instructions for causing the at least one processor to:
store a current-value frequency distribution in the storage, the current-value frequency distribution representing a frequency distribution of acquisition counts of the current values for classes, the current-value frequency distribution including the classes into which a possible range of the current values are divided;
in response to detection of a start of a predetermined period, acquire the current values of the battery charged and discharged, via the current detector each time a predetermined time elapses during the predetermined period, the predetermined period including a period when the vehicle is traveling;
upon acquiring of each of the current values,
(1) store the newly acquired current values so that all the current values acquired during the predetermined period are stored in the storage,
(2) update the current-value frequency distribution stored in the storage based on the newly acquired current values,
(3) determine an actual current-value rate distribution that represents a distribution of the acquisition rates for the classes based on the updated current-value frequency distribution,
(4) store the actual current-value rate distribution in the storage; and
in response to detection of an end of the acquisition period,
(1) stop acquisition of the current values,
(2) read the actual current-value rate distribution and the predetermined current-value rate distributions from the storage,
(3) determine traveling pattern rates based on the actual current-value rate distribution and the predetermined current-value rate distributions, the traveling pattern rates indicating rates of the respective predetermined current-value rate distributions in a case where the actual current-value rate distribution is represented by a combination of the predetermined current-value rate distributions,
(4) store a driving distance of the vehicle during the predetermined period and the traveling pattern rates in the storage,
(5) read (i) the driving distance, (ii) the traveling pattern rates, and (iii) the predetermined battery deterioration degrees from the storage,
(6) determine a battery deterioration degree resulting from driving in the predetermined period based on (i) the driving distance, (ii) the traveling pattern rates, and (iii) the predetermined battery deterioration degrees, and
(7) store the derived battery deterioration degree in the storage.

* * * * *